(12) United States Patent
Kunz et al.

(10) Patent No.: US 12,061,490 B2
(45) Date of Patent: Aug. 13, 2024

(54) ADAPTIVE BIAS CONTROL FOR A VOLTAGE REGULATOR

(71) Applicant: TEXAS INSTRUMENTS INCORPORATED, Dallas, TX (US)

(72) Inventors: Keith E. Kunz, Bryan, TX (US); Rohit Phogat, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 232 days.

(21) Appl. No.: 17/852,618

(22) Filed: Jun. 29, 2022

(65) Prior Publication Data
US 2023/0297128 A1 Sep. 21, 2023

Related U.S. Application Data

(60) Provisional application No. 63/320,140, filed on Mar. 15, 2022.

(51) Int. Cl.
*G05F 1/575* (2006.01)
*G05F 3/26* (2006.01)
*H03F 3/45* (2006.01)

(52) U.S. Cl.
CPC .............. *G05F 1/575* (2013.01); *G05F 3/262* (2013.01); *H03F 3/45381* (2013.01); *H03F 3/45475* (2013.01)

(58) Field of Classification Search
CPC ...... G05F 1/575; G05F 3/262; H03F 3/45381; H03F 3/15475
See application file for complete search history.

(56) References Cited

U.S. PATENT DOCUMENTS

| | | | | |
|---|---|---|---|---|
| 7,382,849 B1* | 6/2008 | Groe | ................... | H03L 7/0896 375/376 |
| 8,547,077 B1* | 10/2013 | Chang | ................... | G05F 1/575 323/275 |
| 2006/0261884 A1* | 11/2006 | Gammie | ............. | H03F 3/45973 330/9 |
| 2010/0052635 A1* | 3/2010 | Wang | ..................... | G05F 1/575 323/280 |
| 2010/0164451 A1* | 7/2010 | Cerchi | ................... | G05F 1/565 323/282 |
| 2010/0213917 A1* | 8/2010 | Pulijala | .................. | G05F 1/575 323/293 |
| 2014/0117956 A1* | 5/2014 | Price | ....................... | G05F 1/575 323/273 |
| 2014/0117958 A1* | 5/2014 | Price | ....................... | G05F 1/468 323/281 |

(Continued)

*Primary Examiner* — Rafael O De Leon Domenech
(74) *Attorney, Agent, or Firm* — Charles F. Koch; Frank D. Cimino

(57) ABSTRACT

One example includes a circuit. The circuit includes a first transistor having a first control terminal, a first current terminal, and a second current terminal. The first control terminal can be a first input to the circuit. The circuit also includes a second transistor having a second control terminal, a first current terminal, and a second current terminal. The second control terminal can be a second input to the circuit. The circuit also includes an adaptive bias current source coupled to the second current terminal of the respective first and second transistors. The circuit further includes a voltage offset generator coupled in parallel with the second transistor.

20 Claims, 2 Drawing Sheets

(56) References Cited

U.S. PATENT DOCUMENTS

2016/0173098 A1* 6/2016 Jaffari ............ H03K 19/018528
                                                                326/83
2017/0315574 A1* 11/2017 Brown .................... G05F 1/468
2022/0360042 A1* 11/2022 Li ........................ H01S 5/06808

* cited by examiner

ADAPTIVE BIAS CONTROL FOR A VOLTAGE REGULATOR

CROSS-REFERENCE TO RELATED APPLICATIONS

This application claims priority to U.S. Provisional Patent Application No. 63/320,140, filed 15 Mar. 2022, entitled "High Gain Adaptive Bias Control", which is incorporated by reference herein in its entirety.

TECHNICAL FIELD

This description relates generally to electronic systems, and more particularly to adaptive bias control for a voltage regulator.

BACKGROUND

A voltage regulator regulates an output voltage using an input voltage that may be any voltage within a specified range. Performance parameters pertaining to a voltage regulator include the no-load quiescent current, transient response, noise, and power supply rejection ratio (PSRR). Quiescent current is the current that flows through the voltage regulator to ground irrespective of any load current that may be present (or no load current). Transient response measures the amount of time the voltage regulator takes to react to a sudden change in load current and again produce a regulated output voltage. Noise can be superimposed on the regulated output voltage and can be produced from a variety of sources within the voltage regulator or even from the input voltage itself. PSRR describes the capability of the voltage regulator to suppress any power supply variations to its output signal. PSRR may be defined as the ratio of the change in the output voltage from the voltage regulator to the change in the regulator's supply voltage. Generally, higher performance voltage regulators are characterized by lower no-load quiescent current, faster transient response, lower noise and higher PSRR across a wide range of load currents.

SUMMARY

One example described herein includes a circuit. The circuit includes a first transistor having a first control terminal, a first current terminal, and a second current terminal. The first control terminal can be a first input to the circuit. The circuit also includes a second transistor having a second control terminal, a first current terminal, and a second current terminal. The second control terminal can be a second input to the circuit. The circuit also includes an adaptive bias current source coupled to the second current terminal of the respective first and second transistors. The circuit further includes a voltage offset generator coupled in parallel with the second transistor.

Another example described herein includes an error amplifier system. The system includes a first transistor configured to conduct a first current responsive to a first input voltage and a second transistor configured to conduct a second current responsive to a second input voltage, so the first and second transistors form a differential pair. The system also includes a current mirror comprising a third transistor coupled to the first transistor and a fourth transistor coupled to the second transistor. The current mirror can be configured to mirror the first current to the fourth transistor. The system also includes an output of the error amplifier arranged between the second transistor and the fourth transistor to provide an error signal that is indicative of a difference between the first and second voltages. The system also includes an adaptive bias current source coupled to the first and second transistors configured to conduct an adaptive bias current comprising the first and second currents. The system further includes a voltage offset generator arranged in parallel with the second transistor. The voltage offset generator can be configured to conduct an offset current having an amplitude that is inversely proportional to the adaptive bias current provided by the adaptive bias current source to generate a negative voltage offset between the second input voltage relative to the first input voltage.

Another example described herein includes an integrated circuit (IC). The IC includes a power transistor configured to provide a load current to a load to generate an output voltage and a sense transistor configured to provide a sense current that is proportional to the load current. The IC also includes an adaptive bias current source circuit configured to generate an adaptive bias current based on the sense current. The IC further includes an error amplifier system. The error amplifier system includes a first transistor configured to conduct a first current responsive to a reference voltage and a second transistor configured to conduct a second current responsive to the output voltage, so the first and second transistors form a differential pair to conduct the adaptive bias current that is a sum of the first and second currents. The error amplifier system also includes an output of the error amplifier coupled to the second transistor to provide an error signal that is indicative of a difference between the reference voltage and the output voltage. The error signal can be provided to control the power transistor and the sense transistor. The error amplifier system further includes a voltage offset generator arranged in parallel with the second transistor. The voltage offset generator can be configured to provide an offset current based on the output voltage to control an amplitude of the second current based on an amplitude of the adaptive bias current.

DETAILED DESCRIPTION

Figure 1:
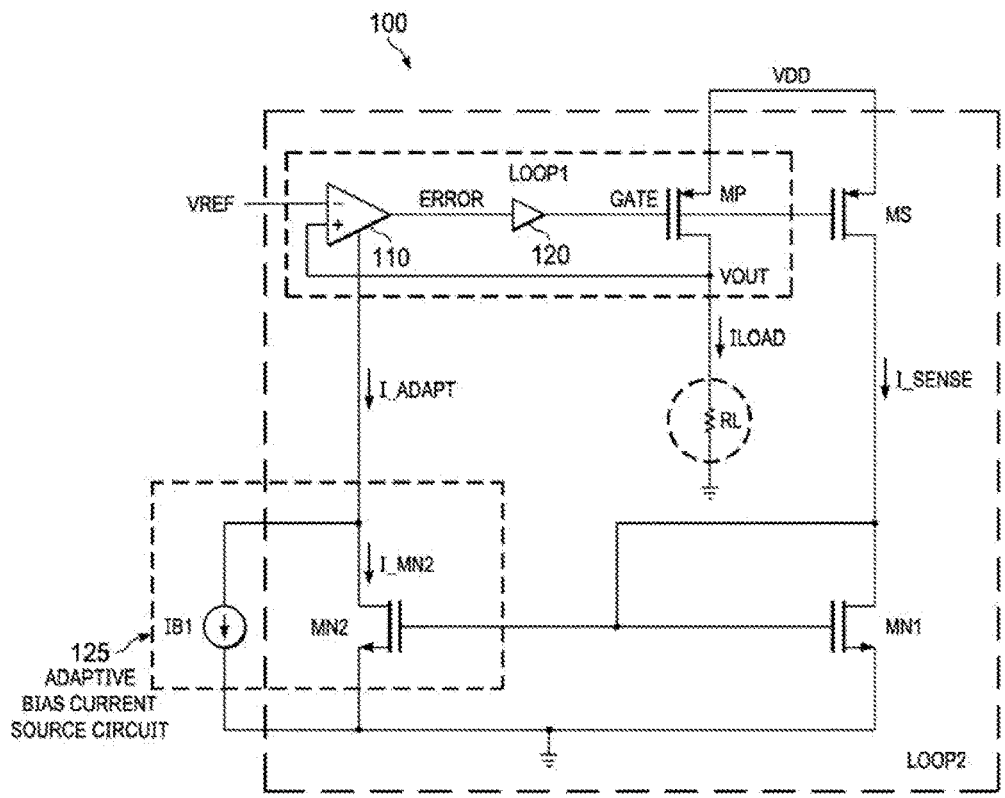
FIG. 1 is an example of a voltage regulator that includes an error amplifier and that employs adaptive bias current.

This description relates generally to electronic systems and, more particularly, to adaptive bias control for a voltage regulator. A voltage regulator (e.g., a low-dropout (LDO) voltage regulator) can include a power transistor configured to conduct a load current to a load and to generate an output voltage. The voltage regulator can also include a sense transistor configured to conduct a sense current that is proportional to the load current. For example, the power transistor and the sense transistor can be fabrication matched (e.g., fabricated on a common wafer under the same fabrication conditions) to exhibit similar operational characteristics. Also, the sense transistor can have a size (e.g., the ratio of channel width W to channel length L) that is proportional to the size of the power transistor to conduct the sense current to have a proportional amplitude (e.g., lesser)

relative to the load current. The voltage regulator includes an adaptive bias current source circuit configured to generate an adaptive bias current based on the sense current. As an example, the adaptive bias current source is arranged as part of a current mirror that is configured to mirror the sense current to generate the adaptive bias current therefore based on the amplitude of the sense current, and by extension, the load current.

The voltage regulator further includes an error amplifier that is configured to compare the output voltage to a reference voltage to generate an error signal. The error signal is provided to control the power transistor and the sense resistor. The error amplifier includes a first transistor that is controlled by the reference voltage to conduct a first current and a second transistor that is controlled by the output voltage to conduct a second current. The first and second currents have a sum that is equal to the adaptive bias current, so the first and second transistors are arranged as a differential pair. The error amplifier also includes a current mirror configured to mirror the first current to an output of the error amplifier. The output of the error amplifier is coupled to the second transistor, so the output is configured to conduct an error signal having an amplitude that is a difference between the mirrored first current and the second current.

The error amplifier further includes a voltage offset generator that is arranged in parallel with the second transistor. As an example, the voltage offset generator includes a fifth transistor and a resistor arranged in series. The voltage offset generator is therefore configured to conduct an offset current to offset the second current to ensure that no more than half of the adaptive bias current flows through the parallel arrangement of the second transistor and the voltage offset generator. Accordingly, the error amplifier can operate with negative feedback to ensure that the error signal does not exhibit instability. Furthermore, the parallel arrangement of the second transistor and the resistor can provide for a more compact circuit design relative to a conventional voltage offset generator in which the transistor of the voltage offset generator is arranged in series with the second transistor, thereby requiring a very large gate area of the transistors that conduct the second current.

FIG. 1 is an example of a voltage regulator 100. The voltage regulator 100 in this example is a low dropout (LDO) regulator that includes an error amplifier 110 that employs adaptive bias current. The principles described herein may pertain to other types of adaptive bias current-based voltage regulators.

The voltage regulator 100 in the example of FIG. 1 includes the error amplifier 110, a buffer 120, a pass field-effect transistor (FET) MP, a sense FET (MS), transistor MN1 and an adaptive bias current source circuit 125. The adaptive bias current source circuit 125 includes transistor MN2 and a current source IB1 (IB1 refers to both the current source device as well as the magnitude of its current). The resistance RL is the resistance of a load that is powered by the voltage regulator 100. The error amplifier 110 includes an inverting input and a non-inverting input. A reference voltage VREF is provided to the negative input. The output voltage VOUT of the voltage regulator 100 is coupled to the positive input. The error amplifier 110 amplifies the difference between the output voltage VOUT and the referenced voltage VREF to produce an error signal ERROR. The output of the error amplifier 110 is coupled to an input of the buffer 120, so the error signal ERROR is provided to the buffer 120. The buffer 120 generates a gate voltage GATE based on the error signal ERROR signal to drive the gate of power transistor MP. The buffer 120 provides sufficient drive potential to drive the gate of MP and may provide voltage scaling to produce the gate voltage GATE at a different (but proportional) voltage than the error signal ERROR.

In this example, transistors MP and MS are p-channel field effect transistors (PFETs). In other examples, MP and MS are implemented as n-channel metal oxide semiconductor field effect transistors (NFETs) with little or no additional modification to voltage regulator 100. The sources of transistors MP and MS are connected together and to a voltage supply VDD. Through the buffer 120, the error signal ERROR signal thus controls the gate-to-source voltage (Vgs) of transistors MP and MS. Because the transistors MP and MS are PFETs in this example, as the error signal ERROR signal decreases, the Vgs of both transistors MP and MS increase, thereby causing an increase in the drain currents through transistors MP and MS. Conversely, as the error signal ERROR signal increases, the Vgs of both transistors MP and MS decrease, thereby causing a decrease in the drain currents through transistors MP and MS. The drain current of power transistor MP is substantially equal to the load current ILOAD, and the drain current of transistor MS is equal to the sense current ISENSE. The size of the transistor MS (e.g., the ratio of channel width W to channel length IL) may be smaller than the size of power transistor MP. Accordingly and because the Vgs of both transistors is the same, the sense current ISENSE is proportional to but smaller than the load current ILOAD. The sense current ISENSE is thus a scaled down version of the load current ILOAD and is used to control the bias current of the error amplifier 110.

Transistors MN1 and MN2 form a current mirror. Transistors MN1 and MN2 in this example are NFETs. The drain of transistor MN1 is coupled to the drain of transistor MS as well as to the gate of transistor MN1. The gates of transistors MN1 and MN2 are coupled together. The sources of transistors MN1 and MN2 are coupled together and to the ground terminal. In one example, the size of transistor MN1 is approximately equal to the size of transistor MN2. Accordingly, the drain current I_MN2 through transistor MN2 is approximately equal to the sense current ISENSE. The current source 1131 is coupled in parallel with the transistor MN2. A bias current I_ADAPT for the error amplifier 110 is the sum of the current IB1 and the current I_MN2. The current IB1 is a fixed current and the current I_MN2 is a function of the load current ILOAD. As the load current ILOAD increases, the current I_MN2 increases, and as the load current ILOAD decreases, the current I_MN2 will likewise decrease. Because the adaptive bias current I_ADAPT is a function of I_MN2, the adaptive bias current I_ADAPT that operates as the bias current of the error amplifier 110 is likewise a function of, and is adaptive based on, the load current ILOAD. The current IB1 ensures that, even if at no-load current (e.g., the sense current ISENSE is approximately zero), the adaptive bias current I_ADAPT is at least equal to the current IB1, thereby providing at least a minimum level of bias current for the error amplifier 110.

Increasing the bias current of the error amplifier 110 for higher load currents achieves a faster transient response, lower noise, and higher power supply rejection ratio (PSRR). At low levels of load current or no-load current, reducing the bias current reduces the quiescent current of the error amplifier 110 to conserve power consumption.

The voltage regulator 100 includes two control loops LOOP1 and LOOP2. LOOP1 includes the error amplifier 110 amplifying the difference between the output voltage VOUT and the referenced voltage VREF to produce the ERROR signal to thereby control the Vgs of the power transistor MP. For example, when the output voltage VOUT increases, the error amplifier 110 responds by increasing the error signal ERROR which results in a reduction of the Vgs of the power transistor MP. Reducing the Vgs of the power transistor MP causes a decrease in the load current ILOAD, and a reduction in the load current ILOAD causes the output VOUT to decrease. The opposite occurs when the load current ILOAD increases, so the error signal ERROR decreases, the Vgs of the power transistor MP becomes larger, and the load current LOAD increases. Per LOOP1, the Vgs of the power transistor MP is controlled by varying the voltage magnitude of the error signal ERROR so as to maintain the output VOUT approximately equal to the reference voltage VREF.

The LOOP2 controls the adaptive bias current I_ADAPT of the error amplifier 110. The LOOP2 includes the generation of the sense current ISENSE by the sense transistor MS and mirroring the sense current ISENSE via the current mirror of the transistors MN1 and MN2. As the load current ILOAD increases, the sense current ISENSE also increases, which causes an increase in the adaptive bias current I_ADAPT. Conversely, if the load current ILOAD decreases, the sense current ISENSE decreases, and the adaptive bias current I_ADAPT also decreases. The gain of the LOOP2 is a function of the gain (gm) of the transistor MN2, the common mode rejection ratio (CMRR) of the error amplifier 110, the gain of buffer 120, the sense ratio between transistors MP and MS (e.g., the size of transistor MS divided by the size of power transistor MP), and the gain (gm) of the transistor MN1.

Figure 2:
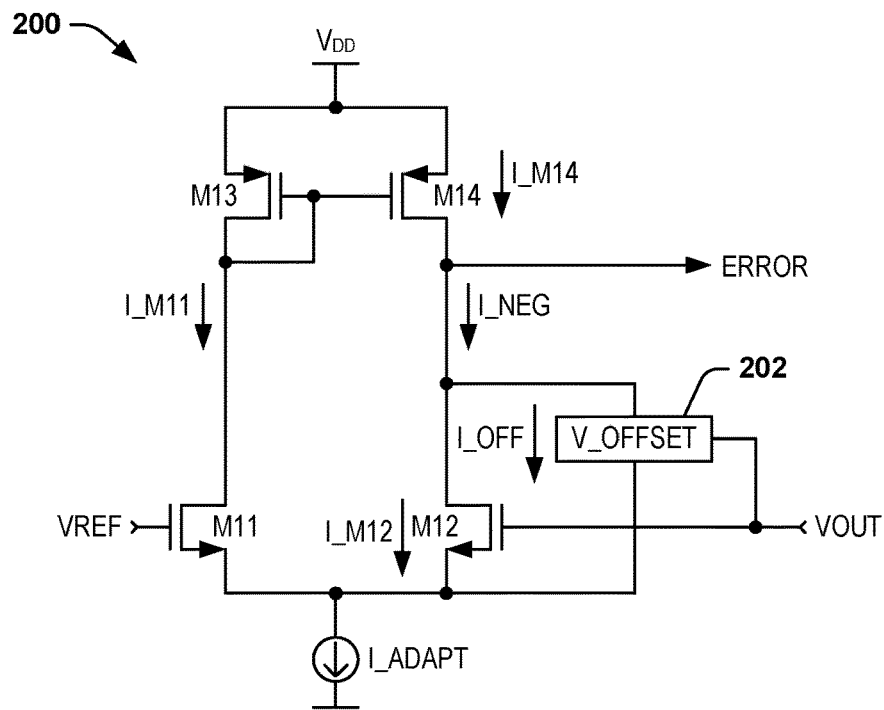
FIG. 2 is an example implementation of an error amplifier that includes a voltage offset generator.

FIG. 2 is an example of an error amplifier 200. The error amplifier 200 in the example of FIG. 2 can be the error amplifier 110 in the example of FIG. 1. Therefore, reference is to be made to the example of FIG. 1 in the following description of the example of FIG. 2.

The error amplifier 200 includes a differential input pair of transistors M11 and M12 and a current mirror formed by transistors M13 and M14. In this example, the transistors M11 and M12 are NFETs and the transistors M13 and M14 are PFETs. The gate of the transistor M1 is the non-inverting input of the error amplifier 200 and the gate of transistor M12 is the inverting input of the error amplifier 200. The sources of transistors M11 and M112 are coupled together at a common node (CN). The adaptive bias current source is shown symbolically as the adaptive bias current I_ADAPT. A portion of the adaptive bias current I_ADAPT flows through the transistor M11 and the remaining portion of the adaptive bias current I_ADAPT flows through the transistor M12 and a voltage offset generator 202 (labeled as V_OFFSET), as described in greater detail below. The transistor M13 couples to the drain of the transistor M11 and the transistor M14 couples to the drain of the transistor M12. The gates of the transistors M13 and M14 are coupled together and to the drains of the transistors M11 and M13 to form a current mirror.

The drains of the transistors M12 and M14 provide the error signal ERROR as an output from the error amplifier 200. If the reference voltage VREF provided at the gate of the transistor M11 increases greater than the output voltage VOUT on the gate of the transistor M12, the Vgs of the transistor M11 becomes larger than the Vgs of the transistor M12, and a greater percentage of the adaptive bias current I_ADAPT flows through the transistor M11 than through the transistor M12. In the example of FIG. 2, the current through the transistor M11 is shown as I_M11 and the current through the transistor M12 and through the voltage offset generator 202 is shown as I_NEG. The current I_M11 that flows through the transistor M11 also flows through the transistor M13 and is mirrored through the transistor M14, with the mirrored current shown as a current I_M14. The current through the transistor M12 and the voltage offset generator 202 is designated as I_NEG and is a function of the Vgs of the transistor M12. Because the Vgs of M12 is smaller than the Vgs of M11, the current I_NEG is smaller than I_M11. Due to the current mirror of the transistors M13 and M14, the current I_NEG also is smaller than I_M14. The current I_M14 being larger than the current I_NEG causes the drain-to-source voltage (Vds) of the transistor M14 to decrease, thereby increasing ERROR signal towards VDD. The opposite occurs if the voltage on the gate of the transistor M12 increases above the voltage on the gate of the transistor M11 resulting the Vds of the transistor M14 increasing, thereby causing a decrease in ERROR signal.

The following example describes the operation of the error amplifier 200 absent the voltage offset generator 202, in which the current I_NEG would flow entirely through the transistor M12. Ideally, the sizes and threshold voltages of the transistors M11 and M12 are identical and thus for equal voltages on the gates of the transistors M11 and M12, the bias current, the adaptive bias current I_ADAPT, divides evenly between I_M11 and I_NEG. However, in practice, the transistors M11 and M12 are not identical in terms of their sizes and threshold voltages. One of the transistors M11 and M12 may be stronger than the other, meaning that for equal values of Vgs, the stronger transistor will have a larger drain current. For example, one of the transistors M11 and M12 is stronger than the other because of differences in their threshold voltages (the transistor with a smaller threshold voltage is stronger than the transistor with a larger threshold voltage). The strength difference between the transistors M11 and M12 results from manufacturing tolerances and is generally unavoidable. As the drain currents of the transistors M11 and M12 are a function of the adaptive bias current the adaptive bias current I_ADAPT.

Continuing the example of the absence of the voltage offset generator 202, because the transistors M11 and M12 are not practically identical, the error amplifier 200 may cause a positive common mode rejection (CMR) feedback or a negative CMR feedback to occur. The strength difference between the transistors M11 and M12 affects the magnitude of ERROR signal. If the transistor M11 is stronger than the transistor M12, as the adaptive bias current I_ADAPT increases with increase in load current (e.g., the load current ILOAD), the current I_M11 becomes larger than the current I_NEG and the error signal ERROR increases. The error signal ERROR increases in this case, not because of changes in the gate voltages of the transistors M11 and M12, but because the adaptive bias current I_ADAPT has increased. Conversely, if the transistor M12 is stronger than the transistor M11, increases in the load current ILOAD causing increases in the adaptive bias current I_ADAPT causes the current I_NEG to become larger than the current I_M11, thereby causing the error signal ERROR to decrease.

Continuing the example of the absence of the voltage offset generator 202, ideally, the error signal ERROR is only modulated based on the difference between the output voltage VOUT and the reference voltage VREF, not also based on the adaptive bias current I_ADAPT. However, with the transistor M11 being stronger or weaker than the transistor M12, the error signal ERROR is also influenced by the adaptive bias current I_ADAPT as explained above. If the gain of the LOOP2 is high enough and the relative strengths of the transistors M1 and M12 are configured so increases in the adaptive bias current I_ADAPT causes the error signal ERROR to decrease, the output voltage VOUT may experience sustained oscillation. If the load current ILOAD were to increase, the sense current ISENSE will increase, thereby causing an increase in the adaptive bias current I_ADAPT. If the transistor M12 is stronger than the transistor M11, an increase in the adaptive bias current I_ADAPT causes the error signal ERROR to decrease (described above). A decrease in the error signal ERROR causes the Vgs of power transistor MP to increase, thereby causing the load current ILOAD to further increase. Accordingly, the differential input pair of the transistors in the error amplifier causes the LOOP2 to be a positive feedback loop.

Accordingly, absent the voltage offset generator 202, the combination of positive feedback and a gain of the LOOP2 that is high enough causes the output voltage VOUT to experience oscillation. Accordingly, the gain of the LOOP2 may be designed so as to have a low enough level to avoid such oscillation. Maintaining the gain of the LOOP2 at a low enough level to avoid oscillation may be implemented, in part, through the selection of the sense ratio between the transistors MP and MS. Designing the error amplifier 200 for a lower gain of the LOOP2 means that adaptive bias current I_ADAPT will be smaller than otherwise would be the case if the gain was higher. As explained above, a higher bias current is desirable for improved noise performance, transient response, and PSRR.

To provide for a negative feedback of the error amplifier to mitigate oscillation of the output voltage VOUT, the error amplifier 200 includes the voltage offset generator 202 that is controlled by the output voltage VOUT. Therefore, by including the voltage offset generator 202, the error amplifier 200 provides a negative feedback for the LOOP2, even if fabrication variations between the transistors M11 and M12 would ordinarily cause a positive feedback for the LOOP2. In the example of FIG. 2, the voltage offset generator 202 is shown in parallel with the transistor M12, and therefore coupled to both the source and drain of the transistor M12.

The voltage offset generator 202 introduces an offset current I_OFF in the negative branch of the error amplifier 200 (e.g., the branch including the transistor M12 with its gate providing the negative input) that receives the output voltage VOUT as an input to the error amplifier 200. Therefore, the current I_NEG is split into a current I_M12 through the transistor M12 and the offset current I_OFF through the voltage offset generator 202. As described herein, the voltage offset generator 202 is configured to provide a negative voltage offset between the output voltage VOUT and the reference voltage VREF responsive to changes in the adaptive bias current IBIAS. For example, the voltage offset generator 202 is configured to provide the offset current I_OFF as variable to change the voltage offset between the output voltage VOUT and the reference voltage VREF to provide a negative feedback of the error amplifier 200 responsive to an increase in the adaptive bias current I_ADAPT. Accordingly, the negative feedback provided by the voltage offset generator 202 can counteract a positive feedback provided responsive to increases in the adaptive bias voltage I_ADAPT, as described above. Thus, the negative feedback exhibited by the error amplifier 200 can result in an increase of the current I_M11 relative to the current I_NEG responsive to an increase in the adaptive bias voltage I_ADAPT.

With the current I_M11 experiencing a larger increase than the current I_NEG, the current I_M14 will be larger than the current I_NEG, thereby causing an increase in the error signal ERROR. An increase in the error signal ERROR results in a decrease in the Vgs of power transistor MP which in turn reduces the load current the load current ILOAD, and thus the LOOP2 with error amplifier 200 will be characterized as a negative feedback loop despite the variations in drive strength between the transistors M11 and M112 due to manufacturing tolerances. By ensuring that the LOOP2 is in a negative feedback configuration, the gain of the LOOP2 can be increased relative to an error amplifier configuration in which the voltage offset generator 202 is absent.

Figure 3:
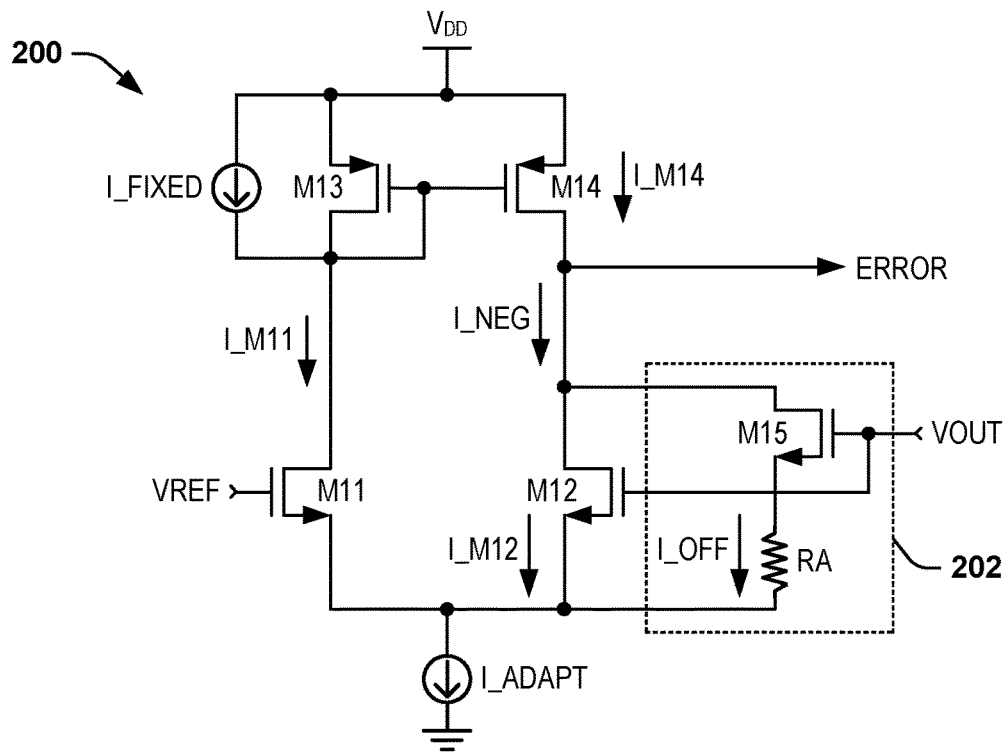
FIG. 3 is another example implementation of an error amplifier that includes a voltage offset generator.

FIG. 3 shows further detail regarding the implementation of the error amplifier 200 of FIG. 2. The voltage offset generator 202 in this example includes a resistor RA coupled to an NFET M15 in series, with the series arrangement of the resistor RA and the transistor M15 being arranged in parallel with the transistor M12. The resistor RA is coupled to the source of the transistor M15, thereby interconnecting the sources of the transistors M12 and M15. The gate of the transistor M15 is coupled to the gate of the transistor M12, so both the transistors of M12 and M15 are controlled by the output voltage VOUT. In the linear region, the transistor M15 has an on-resistance between its drain and source that is generally a function of its Vds divided by the offset current I_OFF amplitude.

Based on the arrangement of the resistor RA and the transistor M15, the offset current I_OFF has an amplitude that is inversely proportional to the amplitude of the adaptive bias current I_ADAPT. Particularly, as the adaptive bias current I_ADAPT increases, the voltage across the resistor RA increases, thereby decreasing the Vgs of the transistor M15 to, in turn, decrease the amplitude of the offset current I_OFF. Therefore, at lower amplitudes of the adaptive bias current I_ADAPT, the on-resistance of the transistor M15 is small, thereby allowing a larger proportion of the current I_NEG to flow through the transistor M15 as the offset current I_OFF. However, as the amplitude of the adaptive bias current I_ADAPT increases, the current path through the transistor M15 becomes more resistive while the current path through the transistor M12 becomes less resistive. As a result, the current I_OFF is greatly decreased while a much larger portion of the current I_NEG is provided as the current I_M12 through the much less resistive path of the transistor M12.

Based on the changes to the amplitude of the offset current I_OFF responsive to changes to the amplitude of the adaptive bias current I_ADAPT, the voltage offset generator 202 therefore generates a negative voltage offset V_OFF between the output voltage VOUT and the reference voltage VREF responsive to increased amplitudes of the adaptive bias current I_ADAPT. The negative offset voltage V_OFF is expressed by the following equation:

$$V\_OFF = (kT/q) * \ln(m1/m2) \qquad \text{Equation 1}$$

Where: $(kT/q)$ is the Thermal Voltage $V_T$ constant;
m1 is a sum of the W/L ratio of the transistor M12 and the W/L ratio of
the transistor M15 $(W/L_{M12} + W/L_{M15})$; and
m2 is the W/L ratio of the transistor M11.

The m1 term is dynamic based on the change in the amplitude of the offset current I_OFF. Particularly, as the offset current I_OFF decreases (e.g. approaching zero) responsive to increases in the adaptive bias current I_ADAPT, the effective W/L ratio of the transistor M15 decreases (e.g., approaching zero). Therefore, responsive to the decrease in the offset current I_OFF, the m1 term likewise decreases to provide a more negative value of the offset voltage V_OFF.

As described above, the reference voltage VREF is provided at a static voltage amplitude, and therefore does not change. Thus, changes to the negative offset voltage V_OFF result in changes to the output voltage VOUT, as provided at the gates of the transistors M12 and M15. Therefore, as the adaptive bias voltage I_ADAPT increases, resulting in a decrease of the offset voltage I_OFF, the voltage offset generator 202 effectively decreases the output voltage VOUT based on increasing the negative offset voltage V_OFF. The negative offset voltage V_OFF can thus provide for a more negative feedback of the error amplifier 200. Accordingly, the negative offset voltage V_OFF providing the negative feedback can counteract a positive feedback of the error amplifier 200 resulting from the transistor M12 being stronger than the transistor M11, as described above. As a result, oscillation of the output voltage VOUT resulting from a combination of positive feedback and a gain of the LOOP2 can be mitigated by the voltage offset generator 202.

In the example of FIG. 3, the error amplifier 200 also includes a fixed current source I_FIXED arranged in parallel with the transistor M13. Based on the inclusion of the current I_FIXED, the current I_M11 through transistor M11 has an amplitude of at least I_FIXED. At low amplitudes of the load current ILOAD, and thus low amplitudes of the adaptive bias current I_ADAPT, the current I_M11 remains at least equal to the current I_FIXED. Therefore, at low amplitudes of the load current ILOAD, the bias current mismatch of the adaptive bias current I_ADAPT with respect to the currents I_M11 and I_NEG is predominantly set by the current I_FIXED. At intermediate levels of the load current ILOAD, the bias current mismatch of the adaptive bias current I_ADAPT with respect to the currents I_M11 and I_NEG is predominantly governed by the series connection of the resistor RA and the transistor M15, and at higher amplitudes of the load current ILOAD, the bias current mismatch of the adaptive bias current I_ADAPT with respect to the currents I_M11 and I_NEG is predominantly governed by the transistor M12.

In addition, the series arrangement of the resistor RA and the transistor M15 in parallel with the transistor M12 can provide for a significantly more compact circuit design relative to a conventional voltage offset generator in which the transistor of the voltage offset generator is arranged in series with the non-inverting input transistor. For example, a voltage offset generator in which the transistor of the voltage offset generator is in series with the non-inverting input transistor can require a very large gate area of the respective transistors that conduct the current. For example, in the conventional voltage offset generator that implements a series connection to the non-inverting input transistor, the differential transistor pair can each have a size ratio (e.g., channel width to channel length) of approximately 10:1, while the transistor of the voltage offset generator can be designed to have a size ratio of 40:1, resulting in an area of approximately 60 $\mu m^2$, to accommodate a large adaptive bias current. However, by implementing the parallel arrangement of the voltage offset generator 202 described herein, the transistor M11 can have a size ratio of 12.5:1, the transistor M12 can have a size ratio of 10:1, and the transistor M15 can have a size ratio of approximately 2.5:1, resulting in an area of approximately 25 $\mu m^2$. Accordingly, the error amplifier 200 described herein can be fabricated in a much more compact form-factor relative to a conventional error amplifier that implements a voltage offset generator.

Figure 4:
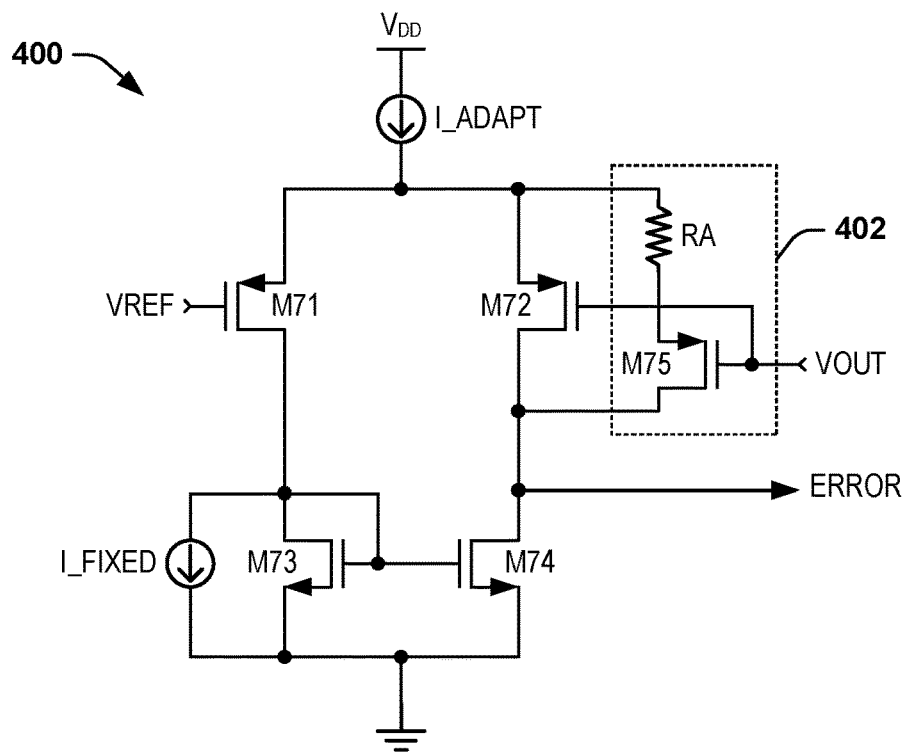
FIG. 4 is yet another example implementation of an error amplifier that includes a voltage offset generator.

FIG. 4 is an example of an error amplifier 400 that includes PFETs M71 and M72 as the differential input pair. Transistors M73 and M74 form the current mirror and are implemented as NFETs. A voltage offset generator 402 is coupled in parallel with the transistor M72. The voltage offset generator 402 includes a resistor RA coupled in series with a PFET M75. The output of the error amplifier 400 is taken from the drains of M72 and M74. The operation of the error amplifier is largely the same as described above for error amplifier 200.

In this description, the term "couple" may cover connections, communications, or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not alter the functional relationship between device A and device B, so device B is controlled by device A via the control signal generated by device A.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

The techniques described herein may also be embodied or encoded in an article of manufacture including a non-transitory computer-readable storage medium. Example non-transitory computer-readable storage media may include random access memory (RAM), read-only memory (ROM), programmable ROM, erasable programmable ROM, electronically erasable programmable ROM, flash memory, a solid-state drive, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

Modifications are possible in the described embodiments, and other embodiments are possible, within the scope of the claims.

What is claimed is:

1. A circuit comprising:
   a first transistor having a first control terminal, a first current terminal, and a second current terminal, the first control terminal being a first input to the circuit;

a second transistor having a second control terminal, a first current terminal, and a second current terminal, the second control terminal being a second input to the circuit;
an adaptive bias current source coupled to the second current terminal of each of the respective first and second transistors; and
a voltage offset generator coupled in parallel with the second transistor.

2. The circuit of claim 1, wherein the voltage offset generator comprises a third transistor, the third transistor having a third control terminal and first and second current terminals, the second and third control terminals are coupled together, and the first current terminal of the third transistor is coupled to the first current terminal of the second transistor.

3. The circuit of claim 2, wherein the voltage offset generator comprises a resistor coupled between the second current terminals of each of the second and third transistors, the resistor and the third transistor are connected in a series arrangement, and the series arrangement of the resistor and the third transistor is arranged in parallel with the second transistor.

4. The circuit of claim 2, wherein the voltage offset generator is configured to conduct an offset current having an amplitude that is inversely proportional to an adaptive bias current provided by the adaptive bias current source to generate a negative voltage offset between the second control terminal relative to the first transistor.

5. The circuit of claim 4, wherein the negative voltage offset V_OFF is defined as:

$$V\_OFF = (kT/q) * \ln(m1/m2)$$

Where: (kT/q) is the Thermal Voltage $V_T$ constant;
m1 is a sum of a W/L ratio of the second transistor and a W/L ratio of the third transistor; and
m2 is a W/L ratio of the first transistor.

6. The circuit of claim 1, further comprising:
a third transistor comprising first and second current terminals, wherein the second current terminal of the fourth transistor is coupled to the first current terminal of the first transistor; and
a second current source coupled the first and second current terminals of the fourth transistor.

7. The circuit of claim 1, wherein the adaptive bias current source is configured to provide an adaptive bias current, and when the adaptive bias current source is flowing, the voltage offset generator is configured to cause more than half of the adaptive bias current to flow through the first transistor and less than half of the adaptive bias current to flow through the parallel arrangement of the second transistor and the voltage offset generator.

8. The circuit of claim 7, further including a second current source coupled to the first current terminal of the first transistor, wherein at least a portion of the adaptive bias current flowing through the first transistor comprises current that is provided from the second current source.

9. An error amplifier comprising the circuit of claim 1, wherein:
the first control terminal is coupled to a first input to the error amplifier,
the second control terminal is coupled to a second input to the error amplifier, and
the error amplifier comprises an output coupled to the first current terminal of the second transistor.

10. A voltage regulator comprising the error amplifier of claim 9.

11. An error amplifier system comprising:
a first transistor configured to conduct a first current responsive to a first input voltage;
a second transistor configured to conduct a second current responsive to a second input voltage, in which the first and second transistors form a differential pair;
an adaptive bias current source coupled to the first and second transistors configured to conduct an adaptive bias current comprising the first and second currents; and
a voltage offset generator arranged in parallel with the second transistor, the voltage offset generator being configured to conduct an offset current having an amplitude that is inversely proportional to the adaptive bias current provided by the adaptive bias current source to generate a negative voltage offset between the second input voltage relative to the first input voltage.

12. The system of claim 11, further comprising:
a current mirror comprising a third transistor coupled to the first transistor and a fourth transistor coupled to the second transistor, the current mirror being configured to mirror the first current to the fourth transistor;
an output of the error amplifier system arranged between the second transistor and the fourth transistor to provide an error signal that is indicative of a difference between the first and second voltages.

13. The system of claim 11, wherein the voltage offset generator comprises a third transistor and a resistor arranged in series, the third transistor is configured to conduct a third current responsive to the second input voltage, the resistor is coupled between a source of each of the second and third transistors, and a Vgs voltage of the third transistor decreases to decrease the offset current responsive to an increase in an amplitude of the adaptive bias current.

14. The system of claim 13, wherein the negative voltage offset V_OFF is defined as:

$$V\_OFF = (kT/q) * \ln(m1/m2)$$

Where: (kT/q) is the Thermal Voltage $V_T$ constant;
m1 is a sum of a W/L ratio of the second transistor and a W/L ratio of the third transistor; and
m2 is a W/L ratio of the first transistor.

15. The system of claim 11, further comprising a current source arranged in parallel with the third transistor, the current source being configured to conduct a fixed bias current, so at least a portion of the first current comprises the fixed bias current.

16. An integrated circuit (IC), comprising:
a power transistor configured to provide a load current to a load to generate an output voltage;
a sense transistor configured to provide a sense current that is proportional to the load current;
an adaptive bias current source circuit configured to generate an adaptive bias current based on the sense current; and
an error amplifier system, the error amplifier system comprising:
a first transistor configured to conduct a first current responsive to a reference voltage;
a second transistor configured to conduct a second current responsive to the output voltage, in which the first and second transistors form a differential pair configured to conduct the adaptive bias current that is a sum of the first and second currents;
an output of the error amplifier system coupled to the second transistor to provide an error signal that is indicative of a difference between the reference voltage and the output voltage, the error signal being provided to control the power transistor and the sense transistor; and a voltage offset generator arranged in parallel with the second transistor, the voltage offset generator being configured to provide an offset current based on the output voltage to control an amplitude of the second current based on an amplitude of the adaptive bias current.

17. The IC of claim 16, wherein the voltage offset circuit is configured to conduct the offset current having an amplitude that is inversely proportional to the adaptive bias current provided by the adaptive bias current source to generate a negative voltage offset between the output voltage relative to the reference voltage.

18. The IC of claim 16, wherein the voltage offset generator comprises a third transistor and a resistor arranged in series, the third transistor is configured to conduct a third current responsive to the output voltage, the resistor is arranged between a source of each of the second and third transistors, and a Vgs voltage of the third transistor decreases to decrease the offset current responsive to an increase in an amplitude of the adaptive bias current.

19. The IC of claim 18, wherein the negative voltage offset V_OFF is defined as:

$$V\_OFF=(kT/q)*\ln(m1/m2)$$

Where: (kT/q) is the Thermal Voltage $V_T$ constant;
m1 is a sum of a W/L ratio of the second transistor and a W/L ratio of the third transistor; and
m2 is a W/L ratio of the first transistor.

20. The IC of claim 16, wherein the error amplifier system further comprises:

a current mirror comprising a third transistor coupled to the first transistor and a fourth transistor coupled to the second transistor, the current mirror being configured to mirror the first current to the fourth transistor; and a current source arranged in parallel with the third transistor, the current source being configured to conduct a fixed bias current, in which at least a portion of the first current comprises the fixed bias current.

* * * * *